United States Patent
Pan et al.

(10) Patent No.: US 6,661,711 B2
(45) Date of Patent: Dec. 9, 2003

(54) IMPLEMENTATION OF AN INHIBIT DURING SOFT PROGRAMMING TO TIGHTEN AN ERASE VOLTAGE DISTRIBUTION

(75) Inventors: Feng Pan, San Jose, CA (US); Tat-Kwan Edgar Yu, Cupertino, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 10/068,245

(22) Filed: Feb. 6, 2002

(65) Prior Publication Data

US 2003/0147279 A1 Aug. 7, 2003

(51) Int. Cl.$^7$ .............................................. G11C 16/04
(52) U.S. Cl. ............................ 365/185.3; 365/185.29; 365/185.24
(58) Field of Search ........................ 365/185.3, 185.26, 365/185.29, 185.24, 185.04, 185.09, 185.11, 185.16, 185.19, 185.22

(56) References Cited

U.S. PATENT DOCUMENTS

| | | | |
|---|---|---|---|
| 5,646,891 A | 7/1997 | Okamoto | 365/185.22 |
| 5,901,090 A | 5/1999 | Haddad et al. | 365/185.29 |
| 5,912,845 A | 6/1999 | Chen et al. | 365/185.3 |
| 5,995,418 A * | 11/1999 | Chen et al. | 365/185.29 |
| 6,011,721 A | 1/2000 | Sunkavalli | 365/185.22 |
| 6,122,198 A | 9/2000 | Haddad et al. | 365/185.22 |
| 6,134,140 A | 10/2000 | Tanaka et al. | 365/185.03 |
| 6,172,909 B1 | 1/2001 | Haddad et al. | 365/185.19 |
| 6,240,023 B1 | 5/2001 | Roohparvar | 365/185.3 |
| 6,252,803 B1 * | 6/2001 | Fastow et al. | 365/285.22 |
| 6,304,485 B1 | 10/2001 | Harari et al. | 365/185.09 |
| 6,307,784 B1 | 10/2001 | Hamilton et al. | 365/185.22 |
| 6,438,037 B1 | 8/2002 | Fastow et al. | 365/185.22 |
| 6,483,751 B2 * | 11/2002 | Chen et al. | 365/185.26 |
| 6,483,752 B2 | 11/2002 | Hirano | 365/185.33 |
| 6,493,266 B1 * | 12/2002 | Yachareni et al. | 365/185.22 |
| 2001/0040836 A1 * | 11/2001 | Mori et al. | 365/240 |

* cited by examiner

Primary Examiner—Thong Le
(74) Attorney, Agent, or Firm—Ritter, Lang & Kaplan LLP (57) ABSTRACT

Methods and apparatus for tightening an erased bit threshold voltage distribution are disclosed. According to one aspect of the present invention, a method for processing erased bits associated with an erased bit distribution which includes an over-erased bit which has a first value that is less than a first threshold voltage value and a bit that has a second value that substantially exceeds a second threshold voltage value includes inhibiting the fast bit. The method also includes applying a soft program pulse to the erased bits such that inhibiting the fast bit substantially prevents the second value from changing and applying the soft program pulse to the over-erased bit substantially causes the first value to increase. In one embodiment, applying the soft program pulse to the over-erased bit substantially causes the first value to increase to a value that is greater than or equal to the first threshold voltage value.

29 Claims, 8 Drawing Sheets

IMPLEMENTATION OF AN INHIBIT DURING SOFT PROGRAMMING TO TIGHTEN AN ERASE VOLTAGE DISTRIBUTION

BACKGROUND OF THE INVENTION

1. Field of Invention

The present invention relates generally to mass digital data storage systems. More particularly, the present invention relates to systems and methods for tightening the erased bit threshold voltage distribution associated with a sector to effectively improve the performance of read operations associated with the sector.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Flash memory storage systems generally include flash memory cells. A flash memory cell may include a transistor with a source and a drain that are formed in a silicon substrate, or a flash memory cell may include a source and a drain that are formed in a well within a silicon substrate. Hence, sectors associated with a flash memory card generally include multiple transistors. When a flash memory cell is programmed, a relatively large voltage may be applied to a drain while a source is grounded, and a larger voltage may be applied to a control gate to raise the voltage potential of a floating gate, as will be understood by those skilled in the art. Programming a memory cell generally involves substantially injecting electrons into a floating gate to create a desired threshold voltage for the memory cell. A desired threshold voltage may be considered to be a voltage that is applied to the control gate of the memory cell to allow conduction to occur through a channel region during a read operation.

Figure 1A:
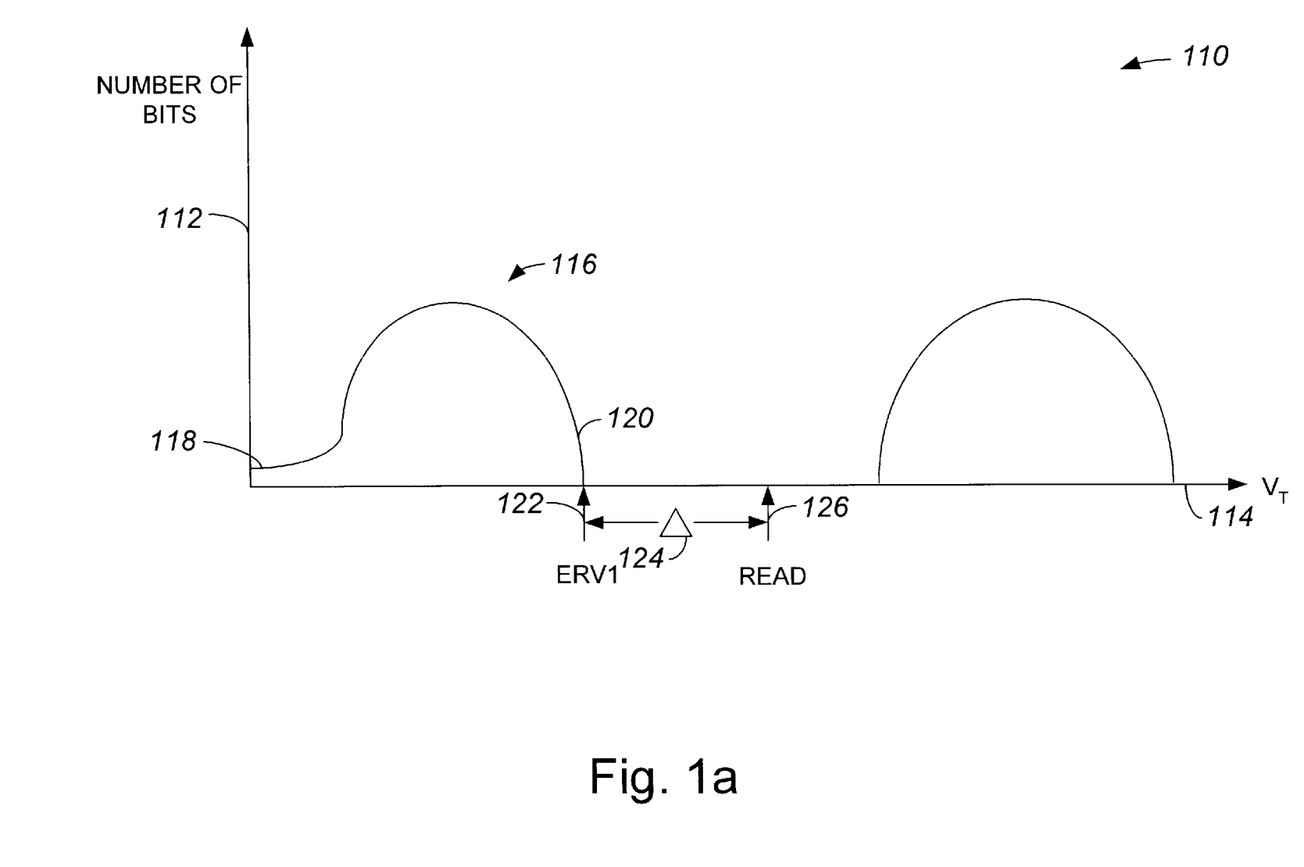
FIG. 1a is a diagrammatic representation of a plot of an erased bit threshold voltage distribution associated with a sector of a memory card.

A cell that is programmed may be erased. When multiple cells or bits within a sector are erased, a distribution of the bits may be created. FIG. 1a is a diagrammatic representation of a plot of an erased bit threshold voltage distribution associated with a sector of a memory card. A plot 110 includes an axis 112 which represents a number of bits and an axis 114 which represents the threshold voltage ($V_T$) associated with a sector or, more specifically, of transistors associated with the sector. An erased bit threshold voltage distribution 116 indicates the disposition of cells or bits associated with a sector or a block. It should be appreciated that the shape of distribution 116 may vary widely and, for purposes of illustration, has been exaggerated. Bits that are most erased or over-erased are reflected in a trailing edge 118, while bits that are least erased are reflected in a leading edge 120.

An erase verify level (ERV1) 122 is generally defined such that preferably all bits in distribution 116 fall below ERV1 122. Typically, ERV1 122 may be set at a negative voltage level, e.g., approximately −0.8 Volts (V), that enables a margin 124 between ERV1 122 and a read level 126 to be maintained. When any bit exceeds read level 126, that bit will generally be read.

When most erased bits, or bits at trailing edge 118 of distribution 116, are too negative, the performance of the overall memory device which includes the sector associated with the bits may be compromised. As will be appreciated by those skilled in the art, most erased or over-erased bits are often associated with transistors which have a relatively low voltage level, e.g., a voltage level of approximately −3.0 V or less. When the voltage level of a transistor is too low, current may be conducted through the transistor. By way of example, leakage currents may flow through the transistor as a result of floating gates associated with the transistors substantially losing electrons. When current is conducted through the transistor due to a voltage that is very negative, the sensing and programming associated with the sector may occur less efficiently. Over-erased or most erased bits also generally take longer to erase than other bits and, as a result, substantially define the erase time associated with substantially all bits of the sector To correct for the most erased bits, distribution 116 may effectively be shifted through the use of a process such as soft programming. Soft programming, as will be appreciated by those skilled in the art, generally involves applying a voltage which effectively shifts most erased bits to a higher voltage level. During soft programming, a relatively high voltage may be provided to a transistor which effectively causes electrons to be pulled onto the floating gate associated with the transistor. In other words, electrons may effectively be injected into the floating gate.

Figure 1B:
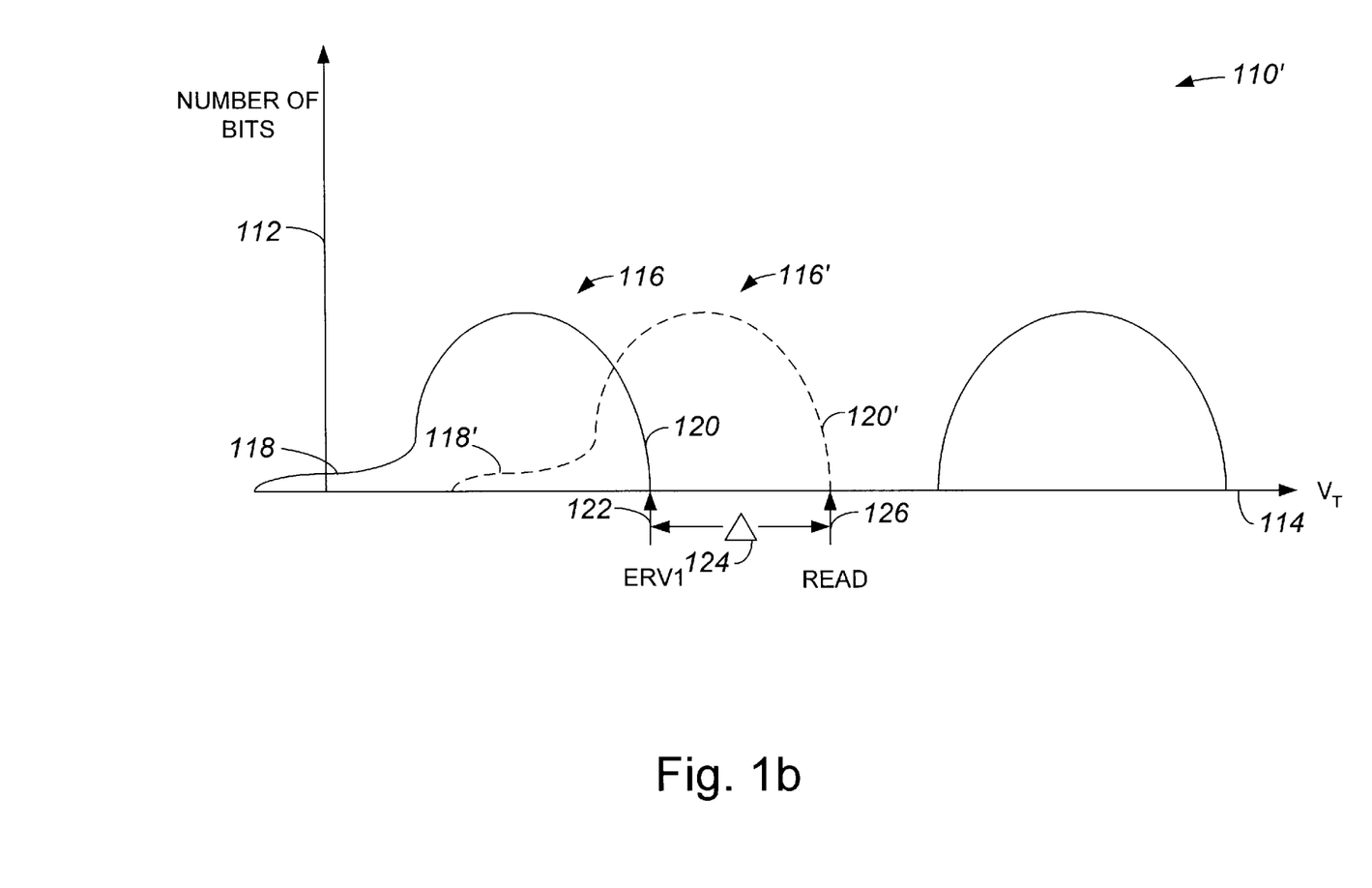
FIG. 1b is a diagrammatic representation of a plot of an erased bit threshold voltage distribution, e.g., plot 110 of FIG. 1a, after a soft program operation.

When most erased bits are corrected using soft programming, least erased bits, or bits associated with leading edge 120 of distribution 116 are affected. Specifically, distribution 116 is shifted such that most erased bits and least erased bits are substantially all less negative. As shown in FIG. 1b, distribution 116 may shift such that after a soft program, distribution 116 becomes shifted distribution 116'. For purposes of illustration, the amount by which distribution 116 shifts to become shifted distribution 116' has been exaggerated. Typically, a soft program will be stopped when a certain number of bits have exceeded ERV1 122. That is, when the number of "failing bits" exceeds a threshold, soft programming is generally stopped. If a certain number of bits have exceeded ERV1 122, and there are still most erased bits that are considered to be too negative, then an erase procedure on the sector which includes the bits may be performed again.

If margin 124 is exceeded by leading edge 120' of distribution 116', some least erased bits may exceed read level 126 and, hence be read during a read operation. Since any least erased bit that is read during a read operation will generally cause a failure of a bit during a read operation, an error correction code (ECC) circuit associated with the memory card may correct for the failure. Although the ECC circuit may correct for the least erased bit that exceeds read level 126, the correction of the least erased bit generally takes away from the bandwidth associated with the ECC circuit. For example, in many memory cards, an ECC circuit may be capable of only correcting for four total bits. As such, the correction of the least erased bit that exceeds read level 126 reduces the number of bits read in a read operation which may be corrected to three.

Figure 1C:
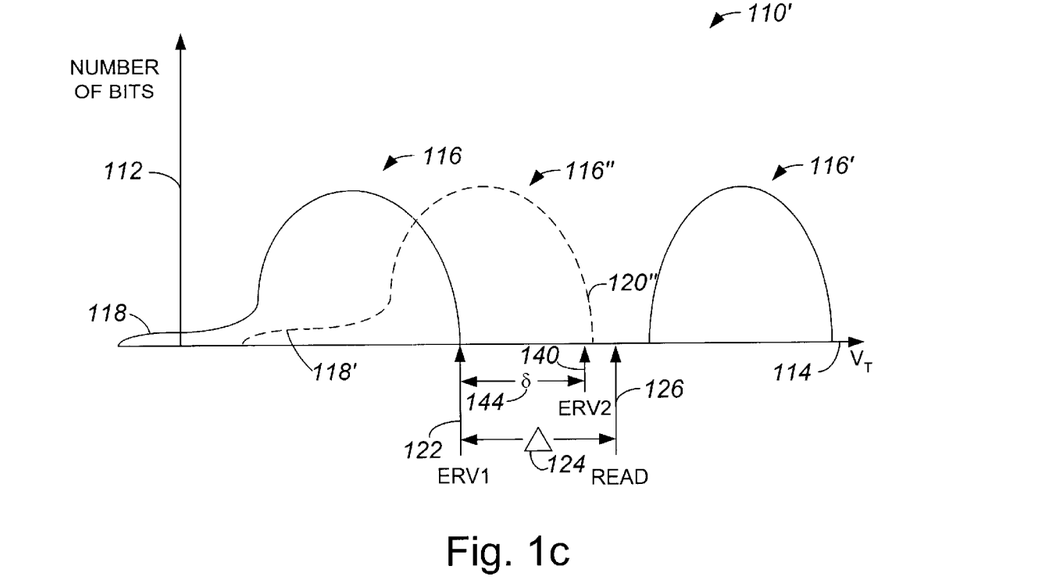
FIG. 1c is a diagrammatic representation of a plot of an erased bit threshold voltage distribution, e.g., plot 110 of FIG. 1a, which includes two erase verify levels, after a soft program operation.

In order to reduce the likelihood that least erased bits exceed read level 126, a second erase verify level (ERV2) may be implemented to enable a least erased bit to be identified before the least erased bit exceeds read level 126. As shown in FIG. 1c, an ERV2 140 is typically set such that ERV2 140 is within margin 124 such that a new margin 144 may be defined by ERV1 122 and ERV2 140. That is, ERV2 140 may have a higher voltage than ERV1 122, and a lower voltage than read level 126. New margin 144 may be selected to meet an erase speed requirement such that if no least erased bits exceed ERV2 140, the erase speed associated with the sector is considered to be acceptable. In addition, of no least erased bits exceed ERV2 140, then the least erased bits may all still be read as erased bits, and not as read bits.

A certain number of bits may be allowed to exceed ERV1 122, and a subset of the bits which exceed ERV1 122 may be allowed to exceed ERV2 140 before a new erase operation is performed. For example, up to eight total bits may be allowed to exceed ERV1 122, with one of the bits also exceeding ERV2 140 before a new erase operation is performed. Although a value for ERV2 140 may be selected such that the bit that exceeds ERV2 140 is not likely to exceed read level 126, the bit that exceeds ERV2 140 may in many cases also exceed read level 126.

While soft programming is generally effective in increasing the $V_T$ of the most erased bits within a sector, soft programming typically also causes the $V_T$ of the least erased bits within the sector to be increased. Shifting or increasing the $V_T$ of the least erased bits may reduce the error correction bandwidth of a subsequent read operation, or may require additional erase operations to be performed. Reducing the error correction bandwidth of a subsequent read operation may increase the likelihood of errors occurring during the read operation, while requiring additional erase operations to be performed may be time consuming and, hence, inefficient.

Further, in some cases, soft programming may cause the width of an erase bit threshold voltage distribution, e.g., distribution 116 of FIG. 1a, to be increased. By way of example, when least erased bits shift more than most erased bits, then the width of an erase bit threshold voltage distribution may become wider, thereby affecting the erase speed associated with a sector.

Therefore, what is needed is a method and an apparatus which enables the $V_T$ of the most erased bits of a distribution to be increased substantially without causing the $V_T$ of the least erased bits of the distribution to be significantly affected. That is, what is desired is a method and an apparatus which enables an erased bit threshold voltage distribution to be substantially tightened.

SUMMARY OF THE INVENTION

The present invention relates to a system and a method for tightening an erased bit threshold voltage distribution. According to one aspect of the present invention, a method for processing erased bits associated with an erased bit distribution which includes an over-erased bit which has a first value that is less than a first threshold voltage value and a bit that has a second value that substantially exceeds a second threshold voltage value includes inhibiting the fast bit. The method also includes applying a soft program pulse to the erased bits such that inhibiting the fast bit substantially prevents the second value from changing and applying the soft program pulse to the over-erased bit substantially causes the first value to increase. In one embodiment, applying the soft program pulse to the over-erased bit substantially causes the first value to increase to a value that is greater than or equal to the first threshold voltage value.

In another embodiment, applying the soft program pulse to the over-erased bit to cause the first value to increase includes applying a low voltage to a drain associated with the over-erased bit. In such an embodiment, inhibiting the fast bit may include applying a high voltage to a drain associated with the fast bit wherein the low voltage is approximately zero volts and the high voltage is approximately five volts.

By inhibiting fast or least erased bits during soft programming, the fast bits are effectively not shifted. In other words, inhibiting fast bits essentially prevents soft programming from causing the threshold voltage associated with the fast bits from increasing. As a result, since soft programming enables the threshold voltage associated over-erased or most erased bits to increase in value, an overall erased bit threshold voltage distribution may be tightened.

According to another aspect of the present invention, a memory storage device includes a plurality of memory cells which are each arranged to be associated with an erased bit of a plurality of erased bits. The device also includes means for inhibiting a first erased bit included in the plurality of erased bits which has a first value that is at least approximately equal to a first threshold voltage, as well as means for applying a soft program pulse to the plurality of erased bits. The means for inhibiting the first erased bit substantially prevents the first value from changing and the means for applying the soft program pulse is arranged to substantially cause a second value associated with a second erased bit to change.

According to still another aspect of the present invention, a method for correcting an over-erase condition associated with a non-volatile memory includes providing the non-volatile memory which includes a sector, and performing an erase operation on the sector. The method also includes determining when a first erased bit of a plurality of erased bits associated with the sector is substantially below an over-erased bit threshold. A determination as to whether a second erased bit of the plurality of erased bits associated with the sector is substantially above a first erase verify level is made when it is determined that the first erased bit is substantially below the over-erased bit threshold. The second erased bit is erased when it is determined that the second erased bit is substantially above the first erase verify level, and a first soft program operation is performed on the plurality of erased bits when it is determined that the first erased bit is substantially below the over-erased bit threshold. Performing the first soft program operation on the plurality of erased bits is arranged to cause the first erased bit to shift in a positive direction and to cause the second erased bit to remain substantially unshifted.

In one embodiment, the method also includes determining when the first erased bit is below the over-erased bit threshold after performing the soft program operation, and god performing a second soft program operation on the plurality of erased bits when it is determined that the first erased bit is below the over-erased bit threshold after performing the soft program operation. In another embodiment, the method includes determining when more than an acceptable number of erased bits is substantially above a second erase verify level which is greater than the first erase verify level.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Soft programming is often used to increase a threshold voltage ($V_T$) of the most erased bits or cells of a threshold voltage distribution within a sector of a non-volatile memory card. Increasing the $V_T$ of the most erased or over-erased bits reduces the amount of current which may be conducted through transistors associated with the most erased bits and, as a result, improves programming processes. However, soft programming typically also causes the $V_T$ of the least erased or fast bits within the sector to be increased, often either to the point where the least erased bits have $V_T$ values that exceed a read level, or to the point where a new erase operation is substantially required.

In order to enable the $V_T$ of the most erased bits to be increased during soft is; programming without causing the $V_T$ of the least erased bits to be increased to the extent that either read operations are compromised or an addition erase operation is effectively needed, the $V_T$ of the least erased bits may be substantially inhibited from being increased during soft programming. That is, to reduce the amount by which the $V_T$ of the least erased bits may be increased when a soft program pulse is applied, the least erased bits may be inhibited such that the least erased bits are effectively not affected by the soft program pulse. For example, once a bit exceeds a first erase verify level (ERV1) or a particular threshold, the bit may be inhibited such that the $V_T$ of the bit substantially does not increase when soft programming occurs. As a result, the $V_T$ of most erased or over-erased bits may be increased substantially without significantly increasing the $V_T$ of the least erased bits. Hence, an overall erase voltage threshold distribution may be tightened, i.e., the difference between the $V_T$ of the most erased bits and the $V_T$ of the least erased bits may be reduced while increasing the $V_T$ of the most erased bits.

Figure 2:
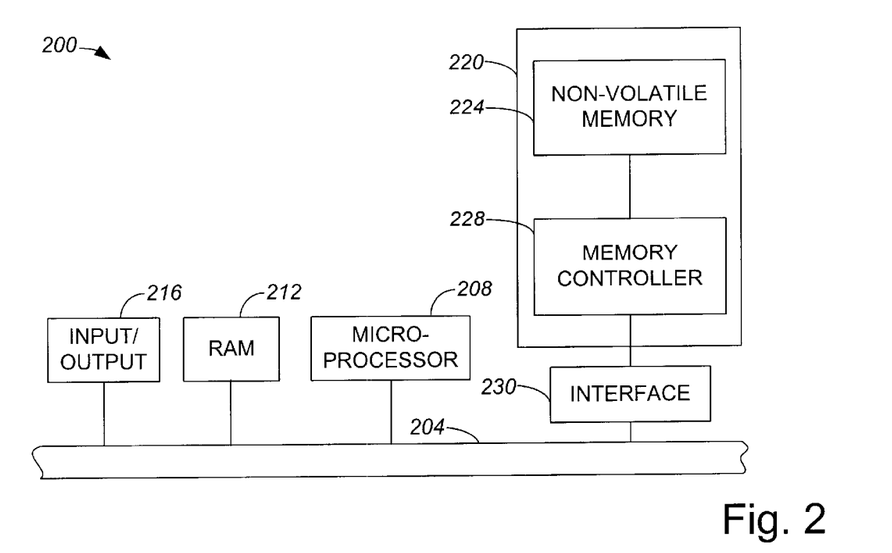
FIG. 2 is a diagrammatic representation of a general host system which includes a non-volatile memory device.

Erased bits or cells are generally associated with a sector of a non-volatile memory device. When the non-volatile memory device is interfaced within a host system, the host system may communicate with the non-volatile memory device to cause bits to be written to, read from, or erased within the non-volatile memory device. Referring initially to FIG. 2, a general host system which includes a non-volatile memory device, e.g., a CompactFlash memory card, will be described. A host or computer system 200 generally includes a system bus 204 which allows a microprocessor 208, a random access memory (RAM) 212, and input/output circuits 216 to communicate. It should be appreciated that host system 200 may generally include other components, e.g., display devices and networking device, which are not shown for purposes of illustration.

In general, host system 200 may be capable of capturing information including, but not limited to, still image information, audio information, and video image information. Such information may be captured in real-time, and may be transmitted to host system 200 in a wireless manner. While host system 200 may be substantially any system, host system 200 is typically a system such as a digital camera, a video camera, a cellular communications device, an audio player,.or a video player. It should be appreciated, however, that host system 200 may generally be substantially any system which stores data or information, and retrieves data or information.

It should be appreciated that host system 200 may also be a system which either only captures data, or only retrieves data. That is, host system 200 may be a dedicated system which stores data, or host system 200 may be a dedicated system which reads data. By way of example, host system 200 may be a memory writer which is arranged only to write or store data. Alternatively, host system 200 may be a device such as an MP3 player which is typically arranged to read or retrieve data, and not to capture data.

A non-volatile memory device 220 which, in one embodiment, is a removable non-volatile memory device, is arranged to interface with bus 204 to store information. An optional input/output circuit block 232 may allow non-volatile memory device 220 to interface indirectly with bus 204. When present, input/output circuit block 232 serves to reduce loading on bus 204, as will be understood by those skilled in the art. Non-volatile memory device 220 includes non-volatile memory 224 and a memory control system 228. In one embodiment, non-volatile memory device 220 may be implemented on a single chip or a die. Alternatively, non-volatile memory device 220 may be implemented on a multi-chip module, or on multiple discrete components which may be used together as non-volatile memory device 220. One embodiment of non-volatile memory device 220 will be described below in more detail with respect to FIG. 3.

Non-volatile memory 224 is arranged to store data such that data may be accessed and read as needed. Data stored in non-volatile memory 224 may also be erased as appropriate, although it should be understood that some data in non-volatile memory 224 may not be erasable. The processes of storing data, reading data, and erasing data are generally controlled by memory control system 228. In one embodiment, memory control system 228 manages the operation of non-volatile memory 224 such that the lifetime of non-volatile memory 224 is substantially maximized by essentially causing sections of non-volatile memory 224 to be worn out substantially equally.

Non-volatile memory device 220 has generally been described as including a memory control system 228, i.e., a controller. Often, non-volatile memory device 220 may include separate chips for non-volatile memory 224 and memory control system 228, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 220 does not include separate memory and controller chips, the memory and controller functions may be integrated into a single chip, as will be appreciated by those skilled in the art.

Figure 3:
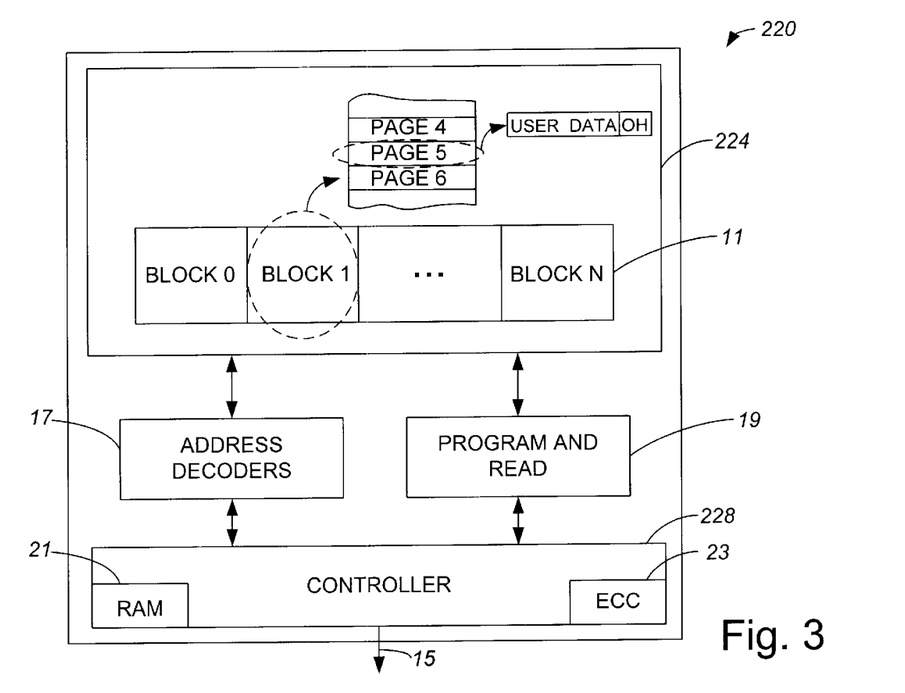
FIG. 3 is a diagrammatic representation of a host computer system, an interface, and a memory device with protected contents.

With reference to FIG. 3, non-volatile memory device 220 will be described in more detail in accordance with an embodiment of the present invention. As described above, non-volatile memory device 220 includes non-volatile memory 224 and memory control system 228. Memory 224 and control system 228, or controller, are primary components of non-volatile memory device 220. Memory 224 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

Control system 228 communicates over a bus 15 to a host computer or other system that is using the memory system to store data. Bus 15 is generally a part of bus 204 of FIG. 2. Control system 228 also controls operation of memory 224, which may include a memory cell array 11, to write data provided by the host, read data requested by the host and perform various housekeeping functions in operating memory 224. Control system 228 generally includes a general purpose microprocessor which has associated non-volatile software memory, various logic circuits, and the like. One or more state machines are often also included for controlling the performance of specific routines.

Memory cell array 11 is typically addressed by control system 228 through address decoders 17. Decoders 17 apply the correct voltages to gate and bit lines of array 11 in order to program data to, read data from, or erase a group of memory cells being addressed by the control system 228. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 228. Control system 228 also usually contains various registers for temporarily storing command and status data, and the like.

Array 11 is divided into a large number of BLOCKS 0–N of memory cells. As is common for flash EEPROM systems, the block may be considered to be the unit of erase. That is, each block may contain the minimum number of memory cells that are erased together. Each block is typically divided into a number of pages, as also illustrated in FIG. 3. A page may be the unit of programming. That is, a basic programming operation writes data into a minimum of one page of cells. One or more sectors of data are typically stored within each page. As shown in FIG. 1b, one sector generally includes user data and overhead data. Overhead data typically includes an error correction code (ECC) that has been calculated from the user data of the sector. A portion 23 of the control system 13 calculates the ECC when data is being programmed into array 11, and also checks the ECC when data is being read from array 11. Alternatively, the ECCs are stored in different pages, or different blocks, than the user data to which they pertain.

A sector of user data typically includes 512 bytes, corresponding to the size of a sector in magnetic disk drives. Overhead data is typically an additional 28 bytes. One sector of data is most commonly included in each page but two or more sectors may instead form a page, as will be appreciated by those skilled in the art. A large number of pages form a block, anywhere from eight pages, for example, up to 512, 1054 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Figure 4A:
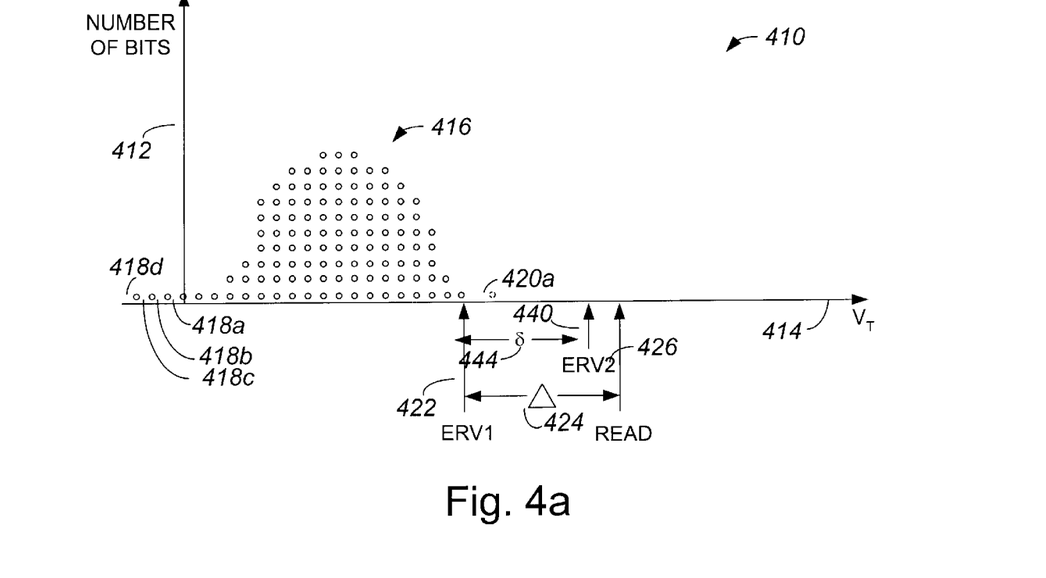
FIG. 4a is a diagrammatic representation of a plot of an erased bit threshold voltage distribution in accordance with an embodiment of the present invention.

As previously mentioned, when bits within a sector of a memory device such as a memory card are erased, some of the bits may be considered to be over-erased or most erased, while other bits may be considered to be least erased. Increasing the $V_T$ of the most erased bits effective during soft programming enables the most erased bits to be corrected. When least erased bits are inhibited, or otherwise prevented from being significantly affected by soft program pulses, an overall erase threshold voltage distribution may be tightened such that the spread of the distribution is less while the most erase bits are corrected. FIG. 4a is a diagrammatic representation of a plot of an erased bit threshold voltage distribution in accordance with an embodiment of the present invention. A plot 410, which is not drawn to scale, includes an axis 412 which indicates a number of bits and an axis 414 which indicates a threshold voltage 414. An erase bit $V_T$ distribution 416 includes most erased or over-erased bits 418 and a plurality of least erased bits which include a least erased bit 420a.

In the embodiment as shown, least erased bit 420a exceeds an ERV1 threshold 422. ERV1 threshold 422 may have substantially any suitable value, e.g., ERV1 threshold 422 may be approximately −0.8 Volts (V). Although least erased bit 420a, which is the fasted bit associated with distribution 416, exceeds ERV1 threshold 422, least erased bit 420a does not exceed an ERV2 threshold 440 which, together with ERV1 threshold 422, substantially defines a margin 444. Margin 444 is typically defined such that when least erased bits fall within margin 444, the erase speed requirements for the sector may still be met. ERV2 threshold 440 is typically less than a read level 426 which is substantially separated from ERV1 threshold 422 by a margin 424. By way of example, ERV2 level 440 may be approximately −0.5 V while read level 426 may be approximately zero volts.

To correct most erased bits 418, i.e., in order to make most erased bits 418 less negative, soft programming of each bit in distribution 416 is implemented by applying voltages to transistors associated with the bits within a non-voltatile memory device such as device 220 of FIG. 2. Distribution 416 indicates the $V_T$ of each bit prior to an initial soft programming operation. In one embodiment, in order to prevent least erased bits such as least erased bit 420a from exceeding read level 426, substantially any least erased bit which exceeds ERV1 threshold 422 may be inhibited to effectively prevent the $V_T$ of any least erased bit which exceeds ERV1 threshold 422 from significantly increasing. As least erased bit 420a exceeds ERV1 threshold 422, least erased bit 420a maybe inhibited such that least erased bit 420a is essentially unaffected by a soft programming operation. One method of inhibiting least erased bit 420a will be described below with respect to FIG. 6.

Figure 4B:
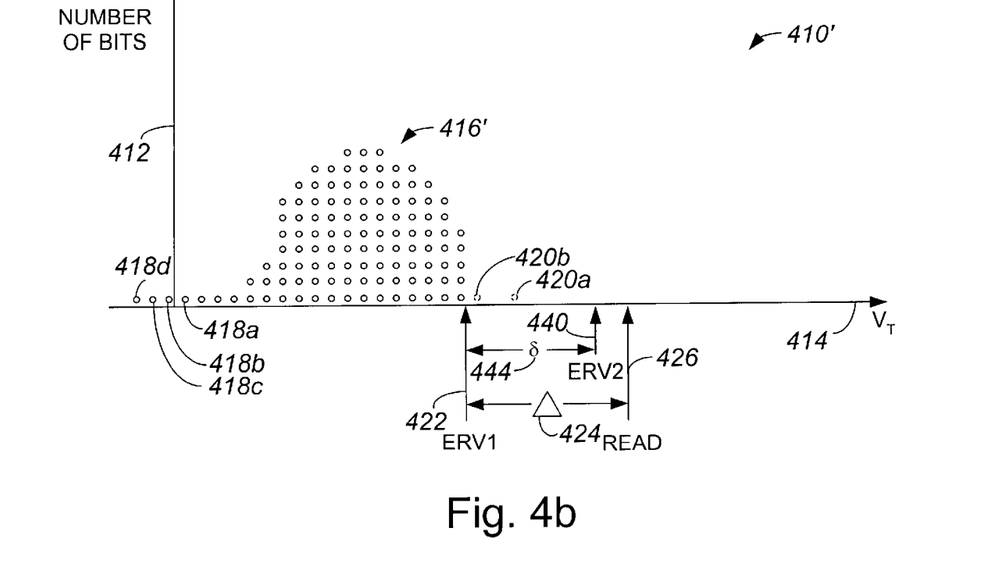
FIG. 4b is a diagrammatic representation of a distribution, e.g., distribution 416 of FIG. 4a, after a soft programming operation which includes a soft program inhibit in accordance with an embodiment of the present invention.

FIG. 4b is a diagrammatic representation of distribution 416 of FIG. 4a after a soft programming operation in accordance with an embodiment of the present invention. After a soft programming operation in which voltage pulses are applied to transistors associated with bits in distribution 416, most erased bits 418 have shifted such that an original most erased bit 418a is no longer considered to be excessively negative. By way of example, if most erased bits 418 are considered to be substantially any bits which are more negative than approximately –3.0V, then when original most erased bit 418a shifts such that the value of original most erased bit 418a is greater than –3.0V, then original most erased bit 418a is no longer considered to be a most erased bit. That is, original most erased bit 418a is generally considered to be in an acceptable range, e.g., between approximately –3.0V and –0.8V, and has not been overprogrammed after a soft programming operation has been completed.

Since least erased bit 420a was inhibited, the $V_T$ of least erased bit 420a effectively did not increase as a result of the soft programming operation. However, the soft programming operation caused a least erased bit 420b, which was previously below ERV1 threshold 422, to shift across ERV1 threshold 422. Since most erased bits 418b–d are still more negative than desired after the soft programming operation, additional soft programming operations are generally performed to correct most erased bits 418b–d and to tighten distribution 416'. Before a subsequent soft programming operation, least erased bit 420b is inhibited, and lease erased bit 420a remains inhibited, to prevent least erased bits 420a, 420b from significantly shifting.

Figure 4C:
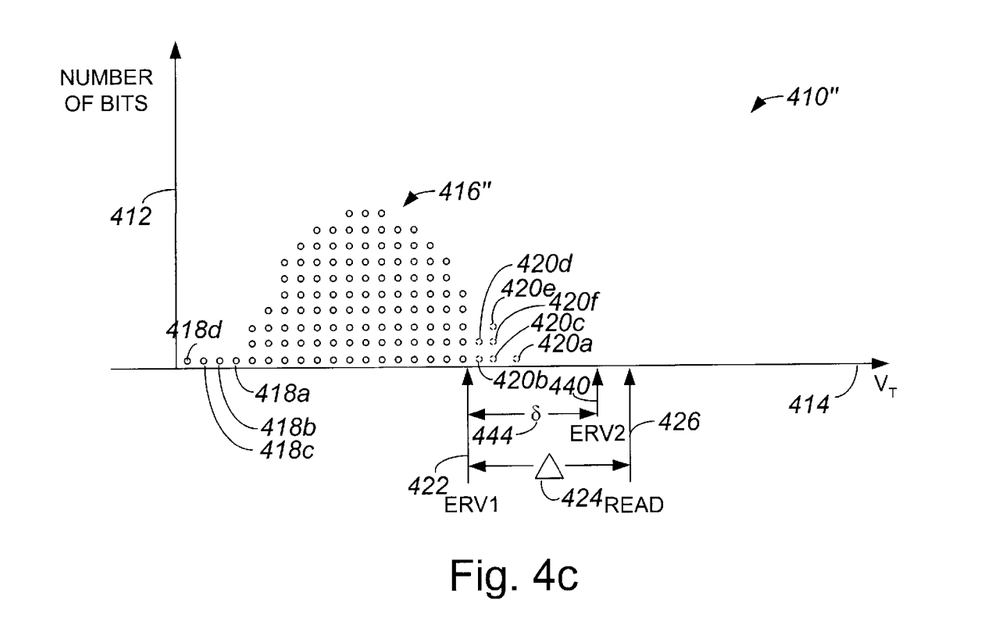
FIG. 4c is a diagrammatic representation of a distribution, e.g., distribution 416 of FIG. 4a, after multiple soft programming operations in accordance with an embodiment of the present invention.

Soft programming operations may generally be repeated until substantially all most erased bits 418 are in a desired range, as shown in FIG. 4c. During the soft programming operations to correct most erased bits 418, any bits, e.g., least erased bits 420, which cross over ERV1 threshold 422 are inhibited. Inhibiting least erased bits 420 may cause some least erased bits 420, such as least erased bits 420b, 420d, to be "stacked" within distribution 416", as least erased bits 420b, 420d may have the same $V_T$.

Distribution 416" is tighter than distribution 416 of FIG. 4a, as the range of $V_T$ values associated with distribution 416" is smaller than the range of $V_T$ values associated with distribution 416. That is, the difference between the minimum $V_T$ and the maximum $V_T$ associated with distribution 416" is less than the difference between the $V_T$ and the maximum $V_T$ associated with distribution 416 of FIG. 4a.

Figure 5A:
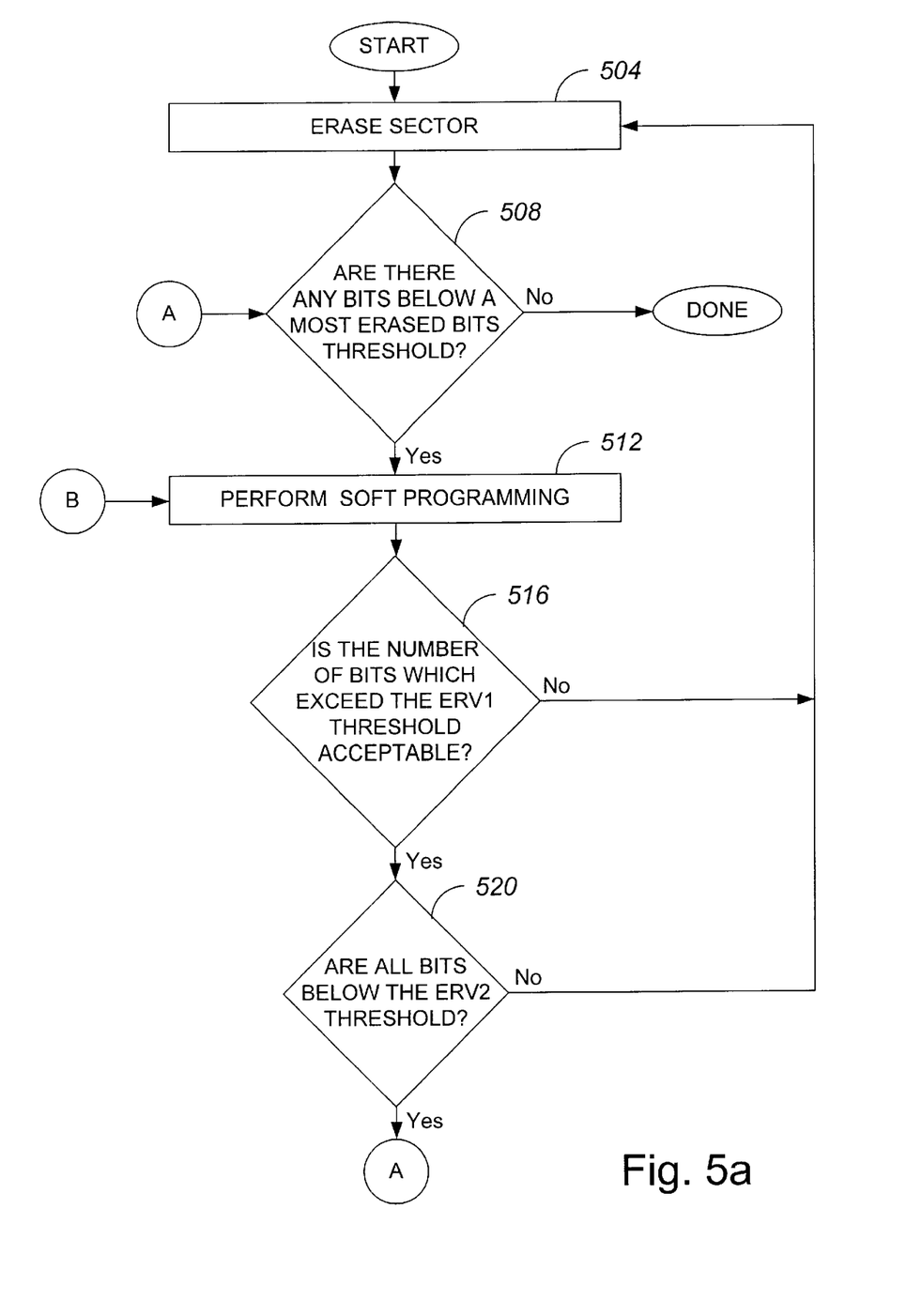
FIGS. 5a and 5b are a process flow diagram which illustrates the steps associated with tightening a $V_T$ distribution associated with a sector in accordance with an embodiment of the present invention.
Figure 5B:
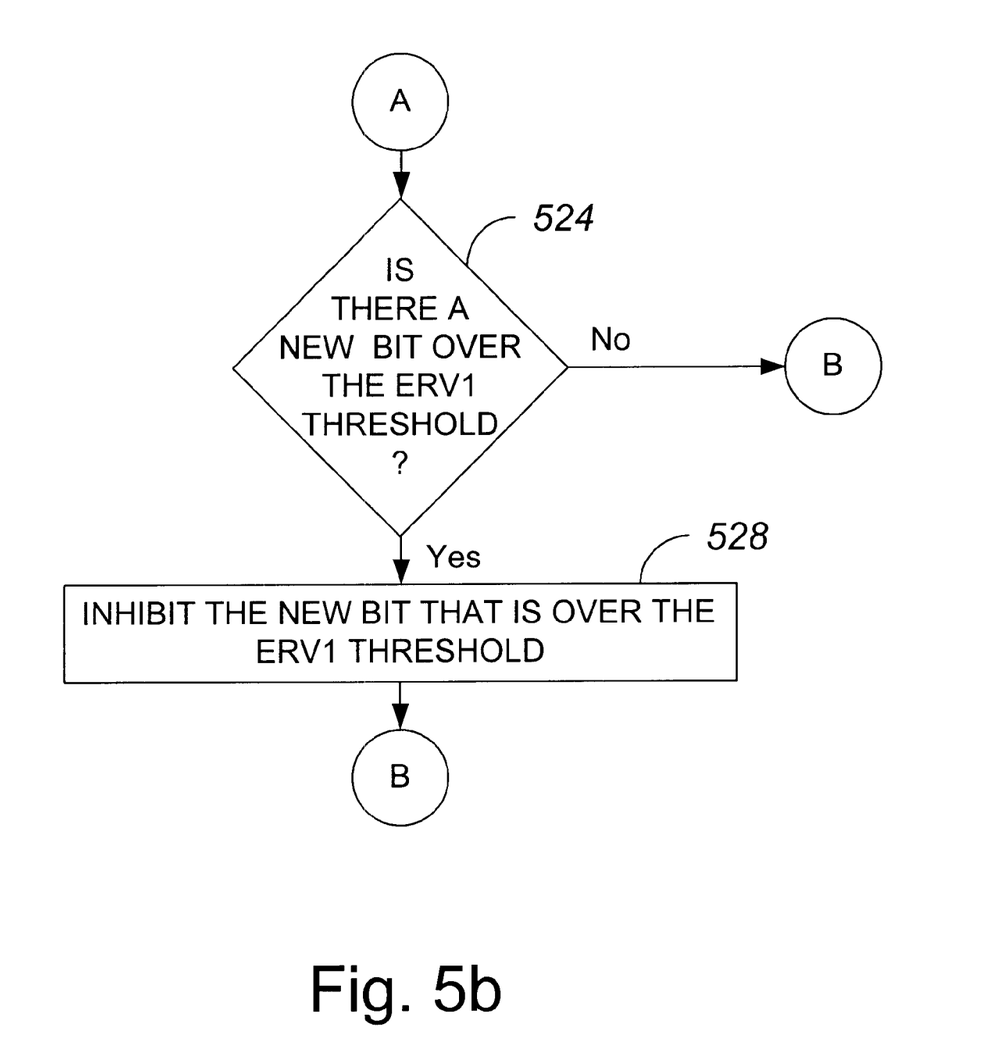

With reference to FIGS. 5a and 5b, the steps associated with tightening a $V_T$ distribution associated with a sector will be described in accordance with an embodiment of the present invention. A process 500 of tightening a $V_T$ distribution begins at step 504 in which a sector is erased. Once the sector is erased, a determination is made in step 508 as to whether there are any bits in the $V_T$ distribution that are below a most erased bits threshold. In other words, it is determined if there are any bits that are effectively too negative, or are otherwise in a very negative state. A most erased bits threshold may vary widely, as discussed above. In one embodiment, the most erased bits threshold may be approximately –3.0 V.

If it is determined in step 508 that there are no bits below the most erased bits threshold, then the indication is that there are effectively no bits which are in a range which may be likely to cause sensing or programming issues by conducting current. As such, the process of tightening a $V_T$ distribution is completed. Alternatively, if it is determined in step 508 that there is at least one bit that is below the most erased bits threshold, then process flow moves to step 512 in which a soft program is performed to substantially raise the voltage level of the bits below the most erased bits threshold. That is, the negative voltage level of the bits below the most erased bits threshold, i.e., the most erased bits, is made less negative.

As discussed above, soft programming causes most erased bits as well as least erased bits to shift within a $V_T$ distribution. Such a shift may cause some least erased bits to exceed an ERV1 threshold or even an ERV2 threshold. A determination is made in step 516 regarding whether the number of bits which exceed the ERV1 threshold is acceptable. Such a determination may be included as a part of a general soft program verification process, and may include counting the failed bits, i.e., the bits which exceed the ERV1 threshold. Although the acceptable number of bits to exceed the ERV1 threshold may vary widely, in one embodiment, the acceptable number of bits is approximately eight. If it is determined that the number of bits which exceed the ERV1 threshold is not acceptable, then process flow returns to step 504 in which the sector is once again erased.

Alternatively, if the determination in step 516 is that the number of bits which exceed the ERV1 threshold is acceptable, then it is determined in step 520 whether substantially all bits within the $V_T$ distribution are below the ERV2 threshold. As previously mentioned, when a bit is above the ERV2 threshold, the bit generally also exceeds the read level in the $V_T$ distribution. Accordingly, when it is determined that there is at least one bit that exceeds the ERV2 threshold, then process flow returns to step 504 in which the sector is once again erased.

On the other hand, when it is determined that all bits are below the ERV2 threshold, then a determination is made in step 524 whether there are any new bits which have a voltage that exceeds the ERV1 threshold. That is, it is determined whether the soft program performed in step 512 caused a bit which was previously below the ERV1 threshold to cross over the ERV1 threshold. When it is determined that no new bit has crossed over the ERV1 threshold, then the indication is that the bits which exceed the ERV1 threshold have all previously been inhibited. Accordingly, process flow returns to step 508 in which it is determined whether there are any bits that are still below the most erased bits threshold. If, however, it is determined in step 524 that there are one or more new bits that have crossed over the ERV1 threshold, then substantially any new bits which have crossed over the ERV1 threshold are inhibited in step 528. It should be understood that substantially any suitable method may be used to inhibit bits. One suitable method will be discussed below with respect to FIG. 6. After any new bits which exceed the ERV1 threshold are inhibited, process flow returns to step 508 in which it is determined whether there are any bits that are still below the most erased bits threshold.

A bit which exceeds a ERV1 threshold may generally be inhibited by substantially any suitable manner which effectively prevents the bit from being becoming over-soft-programmed or, more generally, from being affected by a soft program pulse. During soft programming of a cell, a gate voltage is typically supplied to a control gate, and a drain voltage is typically supplied to a drain, while a well voltage may be supplied to a well. To inhibit soft programming of a cell or a bit, at least one of the applied voltages may be altered. By way of example, a relatively low voltage to may be passed to a drain associated with a bit that is to be subjected to soft programming, while a higher voltage may be passed to a drain to create less of a potential difference across a gate and a drain associated with a bit that is to be inhibited from soft programming.

Figure 6:
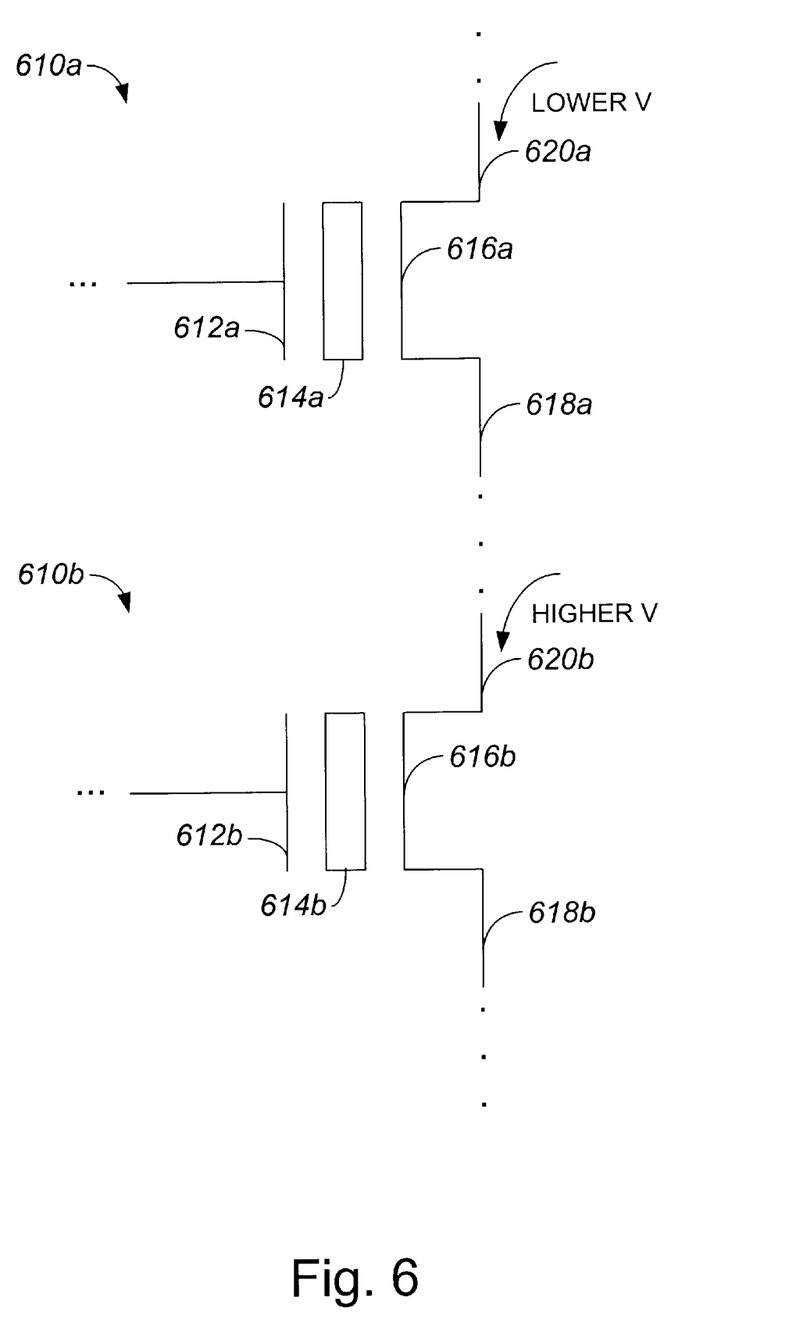
FIG. 6 is a diagrammatic representation of memory cells which are associated with a sector and may either be subjected to soft programming or inhibited from soft programming in accordance with an embodiment of the present invention.

FIG. 6 is a diagrammatic representation of memory cells which are associated with a sector and may either be subjected to soft programming or inhibited from soft programming in accordance with an embodiment of the present invention. Each memory cell 610 or bit may effectively be a floating gate memory transistor. As such, each cell 610 includes a control gate 612, a floating gate 614, a source 618, and a drain 620. A well 616 is also included in each cell 610.

During soft programming, electrons may be injected into floating gates 614, while a gate voltage may be applied to control gates 612, and a well voltage may be applied to wells 616. A source current may be applied to sources 618. Typically, a lower voltage, e.g., a voltage of approximately zero volts, is provided into drain 620*a* of cell 610*a* when cell 610*a* is soft programmed. In order to inhibit soft programming in cell 610*b*, a higher voltage, e.g., a voltage of approximately five volts, may be provided to drain 620*b*. The higher voltage on drain 620*b* effectively inhibits a word line (not shown) associated with cell 610*b*. When a higher voltage is provided to drain 620*b*, the potential difference across gate 614*b* and drain 620*b* may be reduced, thereby effectively inhibiting a soft programming pulse, or the injection of electrons into floating gate 614*b*, from causing the threshold voltage associated with cell 610*b* to increase.

Although only a few embodiments of the present invention have been described, it should be understood that the present invention may be embodied in many other specific forms without departing from the spirit or the scope of the present invention. By way of example, inhibiting cells or bits from being significantly affected by soft programming pulses may be accomplished in substantially any suitable manner. Suitable methods for inhibiting soft program pulses may be selected, in one embodiment, depending upon how programming is implemented. For instance, during a programming process, a relatively high voltage may be placed on a gate, while an approximately zero voltage may be initially placed on a channel to develop a sufficient potential drop across oxide. To reduce the magnitude of a potential drop across oxide, a relatively higher voltage, e.g., Vcc, may be placed on the channel initially. Since the overall potential drop is reduced, the cell us effectively inhibited from programming even with a relatively high gate voltage.

While substantially any fast bit, i.e., least erased bit, may generally be inhibited as soon as the fast bit cross over an ERV1 threshold, it should be appreciated that the fast bit may be inhibited at substantially any time. For instance, in one embodiment, fast bits may not be inhibited until the fast bits begin to approach an ERV2 threshold. Alternatively, fast bits may not be inhibited until after at least two bits have already exceeded the ERV1 threshold.

Soft programming may be inhibited in a system which does not include an ERV2 threshold. In other words, soft programming pulses may be inhibited in a system which does not use an ERV2 threshold such that an erase operation may be repeated substantially only if the number of bits which exceed an ERV1 threshold is considered to be unacceptable, regardless of whether any of the bits have exceeded a read level.

In general, the steps associated with the various processes of the present invention may be widely varied. Steps may be reordered, altered, added, and removed without departing from the spirit or the scope of the present invention. By way of example, the steps associated with inhibiting a soft program operation with respect to a bit may include determining whether an acceptable number of bits exceeds an ERV2 threshold for an embodiment in which at least one bit is allowed to exceed the ERV2 threshold during a soft program verification. Therefore, the present examples are to be considered as illustrative and not restrictive, and the invention is not to be limited to the details given herein, but may be modified within the scope of the appended claims.

What is claimed is:

1. A method for processing erased bits associated with a memory storage device, the erased bits being associated with an erased bit distribution, the erased bits including at least one over-erased bit and at least one fast bit, the at least one over-erased bit having a first value that is less than a first threshold voltage value, the at least one fast bit having a second value that substantially exceeds a second threshold voltage value, the method comprising:

inhibiting the at least one fast bit; and applying a soft program pulse to the erased bits, wherein inhibiting the at least one fast bit substantially prevents the second value from changing and applying the soft program pulse to the least one over-erased bit substantially causes the first value to increase.

2. The method of claim 1 wherein applying the soft program pulse to the at least one over-erased bit substantially causes the first value to increase to a value that is greater than or equal to the first threshold voltage value.

3. The method of claim 1 wherein applying the soft program pulse to the at least one over-erased bit to cause the first value to increase includes applying a low voltage to a drain associated with the at least one over-erased bit.

4. The method of claim 3 wherein inhibiting the at least one fast bit includes applying a high voltage to a drain associated with the at least one fast bit.

5. The method of claim 4 wherein the low voltage is approximately zero volts and the high voltage is approximately five volts.

6. The method of claim 1 wherein applying the soft program pulse to the erased bits causes a third value of a first bit to substantially exceed the second threshold voltage value, and the method further includes:

determining when the first value is less than the first threshold voltage value after applying the soft program pulse to the erased bits;

inhibiting the first bit; and applying a new soft program pulse to the erased bits, wherein inhibiting the first bit substantially prevents the third value from changing and applying the new soft program pulse to the least one over-erased bit substantially causes the first value to increase, and wherein applying the new soft program pulse to the at least one fast bit substantially does not affect the second value.

7. The method of claim 1 wherein the memory storage device is a memory card that includes a non-volatile memory.

8. The method of claim 7 wherein the memory card is one selected from the group consisting of a secure digital card, a Compact Flash card, a multimedia card, a smart media card, and a Memory Stick card.

9. The method of claim 7 wherein the non-volatile memory includes memory cells and the erased bits are associated with the memory cells.

10. A memory storage device, comprising:
  a plurality of memory cells, wherein each memory cell associated with the plurality of memory cells is arranged to be associated with an associated erased bit of a plurality of erased bits;
  means for inhibiting a first erased bit included in the plurality of erased bits, the first erased bit having a first value that is at least approximately equal to a first threshold voltage; and
  means for applying a soft program pulse to the plurality of erased bits, wherein the means for inhibiting the first erased bit substantially prevents the first value from changing and the means for applying the soft program pulse is arranged to substantially cause a second value associated with a second erased bit to change.

11. The memory storage device of claim 10 wherein the means for applying the soft program pulse substantially causes the second value to increase from a value that is less than a second threshold value to a value that is greater than or equal to the second threshold value.

12. The memory storage device of claim 11 wherein the second threshold value is less than the first threshold value.

13. The memory storage device of claim 11 wherein the means for applying the soft program pulse to the plurality of erased bits includes means for applying a low voltage to a drain associated with the second erased bit, the low voltage being an approximately zero voltage.

14. The memory storage device of claim 13 wherein the means for inhibiting the first erased bit includes means for applying a high voltage to a drain associated with the first erased bit, the high voltage being substantially greater than an approximately zero voltage.

15. The memory storage device of claim 10 wherein the memory storage device is one selected from the group consisting of a secure digital card, a Compact Flash card, a multimedia card, a smart media card, and a Memory Stick card.

16. A method for correcting an over-erase condition associated with a non-volatile memory, the method comprising:
  a) providing the non-volatile memory, the non-volatile memory including a sector;
  b) performing an erase operation on the sector;
  c) determining when a first erased bit of a plurality of erased bits associated with the sector is substantially below an over-erased bit threshold;
  d) determining when a second erased bit of the plurality of erased bits associated with the sector is substantially above a first erase verify level when it is determined that the first erased bit is substantially below the over-erased bit threshold;
  e) inhibiting the second erased bit when it is determined that the second erased bit is substantially above the first erase verify level; and
  f) performing a first soft program operation on the plurality of erased bits when it is determined that the first erased bit is substantially below the over-erased bit threshold, wherein performing the first soft program operation on the plurality of erased bits is arranged to cause the first erased bit to shift in a positive direction and to cause the second erased bit to remain substantially unshifted.

17. The method of claim 16 further including:
  determining when the first erased bit is below the over-erased bit threshold after performing the soft program operation; and
  performing a second soft program operation on the plurality of erased bits when it is determined that the first erased bit is below the over-erased bit threshold after performing the soft program operation.

18. The method of claim 17 further including:
  determining when a third erased bit of the plurality of erased bits is substantially above the first erase verify level after performing the first soft program operation; and
  inhibiting the third erased bit before performing the second soft program operation when it is determined that the third erased bit is substantially above the first erase verify level after performing the first soft program operation, wherein inhibiting the third erased bit is arranged to cause the third erased bit to remain substantially unshifted after the second soft program operation is performed.

19. The method of claim 16 further including:
  determining when more than an acceptable number of erased bits is substantially above a second erase verify level, the second erase verify level being greater than the first erase verify level; and
  repeating b)–f) when it is determined that more than the acceptable number of bits is substantially above the second erase verify level.

20. The method of claim 16 further including:
  determining when more than an acceptable number of erased bits is substantially above the first erase verify level; and
  repeating b)–f) when it is determined that more than the acceptable number of bits is substantially above the first erase verify level.

21. The method of claim 16 further including providing a second voltage to a drain associated with the second erased bit, wherein inhibiting the first erased bit includes providing a first voltage to a drain-associated with the first erased bit.

22. The method of claim 21 wherein the first voltage provided to the drain associated with the first erased bit is substantially greater than a second voltage provided to the drain associated with the second erased bit.

23. The method of claim 16 wherein the non-volatile memory is associated with a memory storage device selected from the group consisting of a secure digital card, a Compact Flash card, a multimedia card, a smart media card, and a Memory Stick card.

24. A non-volatile memory, the non-volatile memory including a sector, the nonvolatile memory comprising:
  means for performing an erase operation on the sector;
  means for determining when a first erased bit of a plurality of erased bits associated with the sector is substantially below an over-erased bit threshold;
  means for determining when a second erased bit of the plurality of erased bits associated with the sector is substantially above a first erase verify level when it is determined that the first erased bit is substantially below the over-erased bit threshold;

means for inhibiting the second erased bit when it is determined that the second erased bit is substantially above the first erase verify level; and means for performing a first soft program operation on the plurality of erased bits when it is determined that the first erased bit is substantially below the over-erased bit threshold, wherein the means for performing the first soft program operation on the plurality of erased bits is arranged to cause the first erased bit to shift in a positive direction and to cause the second erased bit to remain substantially unshifted.

25. The non-volatile memory of claim 24 further including: means for determining when more than an acceptable number of erased bits is substantially above a second erase verify level, the second erase verify level being greater than the first erase verify level.

26. The non-volatile memory of claim 24 further including: means for determining when more than an acceptable number of erased bits is substantially above the first erase verify level.

27. The on-volatile memory of claim 24 further including: means for providing a second voltage to a drain associated with the second erased bit, wherein the means for inhibiting the first erased bit include means for providing a first voltage to a drain associated with the first erased bit.

28. The non-volatile memory of claim 27 wherein the first voltage provided to the drain associated with the first erased bit is substantially greater than the second voltage provided to the drain associated with the second erased bit.

29. The non-volatile memory of claim 24 wherein the non-volatile memory is associated with a memory storage device selected from the group consisting of a secure digital card, a Compact Flash card, a multimedia card, a smart media card, and a Memory Stick card.

* * * * *

UNITED STATES PATENT AND TRADEMARK OFFICE
CERTIFICATE OF CORRECTION

PATENT NO. : 6,661,711 B2
DATED : December 9, 2003
INVENTOR(S) : Pan et al.

It is certified that error appears in the above-identified patent and that said Letters Patent is hereby corrected as shown below:

Column 16,
Line 3, please change "on-volatile" to -- non-volatile --

Signed and Sealed this

Twenty-fourth Day of February, 2004

JON W. DUDAS
*Acting Director of the United States Patent and Trademark Office*